United States Patent [19]

Hayashide

[11] Patent Number: 5,318,920
[45] Date of Patent: Jun. 7, 1994

[54] METHOD FOR MANUFACTURING A CAPACITOR HAVING A ROUGH ELECTRODE SURFACE

[75] Inventor: Yoshio Hayashide, Hyogo, Japan

[73] Assignee: Mitsubishi Denki Kabushiki Kaisha, Tokyo, Japan

[21] Appl. No.: 956,225

[22] Filed: Oct. 5, 1992

[30] Foreign Application Priority Data

Oct. 17, 1991 [JP] Japan .................. 3-267979

[51] Int. Cl.$^5$ .................... H01L 21/265
[52] U.S. Cl. .................... 437/47; 437/60; 437/919; 437/977; 148/DIG. 1; 148/DIG. 14; 148/DIG. 138
[58] Field of Search .......... 437/919, 977, 47, 60; 148/DIG. 1, DIG. 14, DIG. 138

[56] References Cited

U.S. PATENT DOCUMENTS

| | | | |
|---|---|---|---|
| 4,977,098 | 12/1990 | Yu et al. | 148/DIG. 1 |
| 5,037,773 | 8/1991 | Lee et al. | 437/977 |
| 5,043,780 | 8/1991 | Fazan et al. | 257/534 |
| 5,135,886 | 8/1992 | Manocha et al. | 148/DIG. 1 |
| 5,208,479 | 5/1993 | Mathews et al. | 437/919 |

FOREIGN PATENT DOCUMENTS

| | | | |
|---|---|---|---|
| 0436491A1 | 7/1991 | European Pat. Off. | H01L 27/108 |
| 6442161 | 2/1989 | Japan | H01L 27/04 |

OTHER PUBLICATIONS

M. Yoshimaru et al., "Rugged Surface Poly-Si Electrode And Low Temperature Deposited Si$_3$N$_4$ For 64MBIT And Beyond STC Dram Cell", CH2865-4/90/0000-0659, IEDM90 659-IEDM90 662, 27.4.1-27.4.4, 1990.
M. Sakao et al., "A Capacitor-Over-Bit-Line (COB) Cell With A Hemispherical-Grain Storage Node For 64Mb Drams", Microelectronics Research Laboratories, NEC Corp., CH2865-4/90/0000-0655, IEDM90 655-IEDM90 658, 27.3.1.-27.3.4, 1990.
Pierre C. Fazan et al., "Electrical Characterization Of Textured Interpoly Capacitors For Advanced Stacked Drams", Micron Technology Inc., CH2865-4/90/00-00-0663, IEDM90 663-IEDM90 666, 27.5.1.-27.5.4., 1990.
"Fabrication of Storage Capacitance-Enhanced Capacitors with a Rough Electrode", by Yoshio Hayashide et al. Japanese Journal of Applied Physics, vol. 29, No. 12, Dec. 1990, pp. L2345-L2348.
"New stacked capacitor structure using hemispherical-grain polycrystalline-silicon electrodes", by H. Watanabe et al., Appl. Phys. Lett. 59 (3), Jan. 21, 1991, pp. 251-253.

Primary Examiner—Shrive Beck
Assistant Examiner—Benjamin L. Utech
Attorney, Agent, or Firm—Lowe, Price, LeBlanc & Becker

[57] ABSTRACT

A silicon layer having semispherical protrusions of about 100 nm is formed as a lower electrode of a capacitor by low pressure vapor deposition method. A silicon oxide film is formed by oxidizing the surface of this silicon layer. The intervals between the rough portions of the silicon layer are increased by removing this silicon oxide film. Thereafter, a dielectric layer and an upper electrode are formed. In other methods, after the formation of the silicon layer having the roughness, thermal treatment is continuously carried out in oxygen-free atmosphere to increase radius of curvature of the roughness of the silicon layer. Thereafter, the dielectric layer and the upper electrode are formed.

6 Claims, 15 Drawing Sheets

FILM THICKNESS OF THE SILICON OXIDE FILM
(ON A MONITOR WAFER) (Å)

FILM THICKNESS OF THE SILICON OXIDE FILM
(ON A MONITOR WAFER) (Å)

| SIGNAL | UPPER ELECTRODE VOLTAGE | PROCESS |
|---|---|---|
| △ | POSITIVE | CVD CORMATION ONLY |
| ▲ | NEGATIVE | |
| □ | POSITIVE | CVD FORMATION + 2hr ANNEAL PROCESS |
| ■ | NEGATIVE | |
| ◇ | POSITIVE | CVD FORMATION + 10hr ANNEAL PROCESS |
| ◆ | NEGATIVE | |

METHOD FOR MANUFACTURING A CAPACITOR HAVING A ROUGH ELECTRODE SURFACE

BACKGROUND OF THE INVENTION

1. Field of the Invention

The present invention relates to a method for manufacturing a capacitor for increasing an effective capacitance region of a stacked type capacitor.

2. Description of the Background Art

A DRAM (Dynamic Random Access Memory) capable of random input/output of a stored information is one of the semiconductor memory devices. DRAM is constituted by a memory cell array serving as a memory region for storing multiple pieces of information, and peripheral circuits for carrying out a prescribed input-/output operation to and from this memory cell array. The memory cell array additionally includes a plurality of memory cells each corresponding to a minimum storage unit. A memory cell is basically constituted by one capacitor and one transfer gate transistor connected thereto. In operation, the memory cell determines whether a prescribed electric charge is stored in the capacitor or not, which corresponds to data "0" and "1", whereby stored information is processed.

FIG. 24 is a cross section of a conventional DRAM. This DRAM is shown, for example, in Japanese Patent Laying-Open No. 64-42161. The memory cell of DRAM shown in FIG. 24 has a so-called one transistor one capacitor type cell structure. A transfer gate transistor 10 includes a pair of n+ impurity regions 3a and 3b formed on a surface of a p type silicon substrate 1, and a gate electrode 5a with a thin gate insulating film 4 thereunder on the surface of silicon substrate 1 placed between these n+ impurity regions 3a and 3b. Gate electrode 5a is constituted by a part of a word line. A first interlayer insulating layer 30 covers around gate electrode 5a. Furthermore, a capacitor 20 includes a lower electrode (storage node) 21 connected to one n+ impurity region 3a, a dielectric layer 22 covering a surface of this lower electrode 21, and an upper electrode (cell plate) 23 covering a surface of dielectric layer 22. A bit line 7 is connected to n+ impurity region 3b through a contact hole formed in a second interlayer insulating layer 31.

Recently, as the degree of integration of a semiconductor device improves, in this type of DRAM, it becomes necessary to miniaturize each individual element. As a result, such memory cell shown in FIG. 24 is compelled to decrease a plane occupation area of capacitor 20. Therefore, mainly two methods are taken for obtaining a prescribed electrostatic capacity required for the operation of the capacitor of the memory cell.

A first method is to increase electrostatic capacity by making thin the dielectric layer 22 forming capacitor 20. For example, in a DRAM having 1M bit integration level, dielectric layer 22 is made as thin as 10 nm level in the film thickness of silicon oxide film conversion. Therefore, it is difficult to make the layer thin when its integration level further increases.

A second method is to obtain the electrostatic capacity by increasing opposing areas between electrodes 21 and 23 opposing each other with dielectric layer 22 in between. The capacitor designed by this method is referred to as a so-called stacked type capacitor. That is, it is made of a structure forming a polycrystal silicon layer having a conductivity on a surface of a diffusion layer in the semiconductor substrate, and thereafter stacking the dielectric layer and the second electrode layer on a surface of the polycrystal silicon layer. Various types of the stacked type capacitors were designed. For instance, a form of the electrode layer constituted by the polycrystal silicon was changed to a fin form, or to a cylindrically projected form.

Furthermore, as another aspect of the second method, a method of forming a roughness on the surface of the lower electrode to increase the opposing areas of the capacitor was designed. The memory cell shown in FIG. 24 has a capacitor including lower electrode 21 having such rough surface.

FIGS. 25 to 27 are cross sections showing in order, manufacturing steps (first to third steps) of the memory cell in such DRAM. Manufacturing method is described in the following in conjunction with these views.

Firstly, referring to FIG. 25, a field oxide film 2 constituted by a thick silicon oxide film is formed in a prescribed region on a surface of a p type silicon substrate 1 in accordance with LOCOS method. Thereafter, a gate oxide film 4 is formed on the surface of p type silicon substrate 1 by thermal oxidation. After depositing a polycrystal silicon layer in the whole region by CVD (Chemical Vapor Deposition) method, it is patterned to form a gate electrode 5a. A silicon oxide film is deposited in the whole region by low pressure CVD method, and thereafter a first interlayer insulating layer 30 is formed on a surface and on sides of gate electrode 5a in accordance with lithography and dry etching technologies as well known in the art. Furthermore, n+ impurity regions 3a and 3b are formed by ion implantation of impurities in p type silicon substrate by utilizing gate electrode 5a covered by interlayer insulating layer 30 as a mask.

Secondly, referring to FIG. 26, a polycrystal silicon layer 210 having the film thickness of 0.4 μm is formed in accordance with low pressure CVD method utilizing a monosilane gas diluted to 20% by helium. Pressure is set at 0.8 Torr and temperature is set at 680° C. The roughness in the level of 0.07 μm is formed on the surface of polycrystalline silicon layer 210 manufactured by this step. Thereafter, phosphorus (P) is introduced in polycrystal silicon layer 210 by thermal diffusion method using an oxine phosphorus chloride (POCl₃) as a material under the condition of the temperature of 875° C. for 30 minutes. After a phosphorus glass formed in the thermal diffusion, on the surface of polycrystal silicon layer 210 is removed, thermal treatment is carried out in a nitride atmosphere at the temperature of 900° C. for 20 minutes. As a result, the roughness of the surface of polycrystal silicon layer 210 expands to 0.11 μm.

Referring to FIG. 27, a lower electrode 21 of a capacitor is formed by patterning polycrystal silicon layer 210 in accordance with photolithography and etching method. A thermal nitride film is formed on a surface of lower electrode 21. A silicon nitride film is formed on a surface of the thermal nitride film in accordance with CVD method. Moreover, an oxide film is formed on a surface of the silicon nitride film by thermal oxidation method. As a result, a dielectric layer 22 constituted by three layers of thermal nitride film/CVD silicon nitride film/silicon oxide film is formed.

Referring to FIG. 24, a polycrystalline silicon layer is formed on the whole region of a surface of a p type silicon substrate. It is patterned into a prescribed form, so that an upper electrode 23 of a capacitor 20 is formed. Thereafter, a second interlayer insulating layer 31 constituted by a thick oxide film is formed on the whole region. A contact hole is formed on a prescribed region of interlayer insulating layer 31, and a bit line 7 is formed in the contact hole.

The memory cell of DRAM is completed in accordance with the steps mentioned above.

Many projected parts are formed on the surface of lower electrode 21 of the capacitor formed in accordance with conventional method. FIG. 28 is an enlarged partial cross section showing the surface form of lower electrode 21. As shown in FIG. 28, there are partially narrowed regions generated in the intervals between the projected parts. When gate dielectric layer 22 is formed with the small intervals between the projections, the gap between the projections is filled up by the gate dielectric layer, resulting in not uniform film thickness of dielectric layer 22. As a result, parts which cannot provide a sufficient capacitance are generated. Under such conditions, a problem is caused. That is, an effect of increasing the capacity by increasing the opposing areas between the electrodes of the capacitors by the formation of the roughness on the surface of lower electrode 21 cannot be achieved.

As mentioned above, the gate dielectric layer is formed to have thin film thickness in order to increase capacitance of the capacitor. Therefore, when a radius of curvature of the rough parts on the surface of lower electrode 21 is small as compared with the film thickness of the gate dielectric layer, an electric field concentration is likely to be produced near such rough parts. As a result, reliability of the capacitor is decreased, because of a decrease of a breakdown voltage of the gate dielectric layer.

SUMMARY OF THE INVENTION

One object of the present invention is to provide a method of manufacturing a capacitor which can effectively utilize a rough surface formed in a lower electrode of the capacitor as a capacitance region.

Another object of the present invention is to provide a method of manufacturing a capacitor which can improve a breakdown voltage of a dielectric layer formed on a surface of a lower electrode of a capacitor having a rough surface.

The present invention is a method of manufacturing a capacitor constituted by a stacked structure of a first electrode layer constituted by a silicon layer on a semiconductor substrate, a dielectric layer, and a second electrode layer, and includes the following steps. Firstly, a silicon layer for a first electrode layer by chemical vapor deposition method, in which a polycrystal silicon grain is included in an amorphous silicon, a surface of the silicon layer being formed with semispherical protrusion. Secondly, a silicon oxide film is formed on the surface of the silicon layer by oxidizing the surface of the silicon layer having the semispherical protrusions. Then, at least the silicon oxide film is removed, and the surface of the silicon layer is exposed. Thereafter, a dielectric layer is formed on the surface of the silicon layer. Furthermore, a second electrode layer is formed on the surface of the dielectric layer.

In the manufacturing method in accordance with the present invention, when a silicon layer in which a polycrystal silicon grain is included in an amorphous silicon is formed by chemical vapor deposition method, 100 nm level semispherical protrusions are formed on a surface of the silicon layer. When the surface of the silicon layer having the roughness is oxidized, a silicon oxide film is formed along the rough surface of the silicon layer. A part of the silicon oxide film is formed by internal reaction from the surface of the original silicon layer. When this silicon oxide film is removed, the surface of the silicon layer having roughness is equally removed, and thereby expanding the intervals between the projected parts of the surface of the silicon layer. When a dielectric layer is formed on the surface of the silicon layer in which the rough form is adjusted, the dielectric layer is almost uniformly formed along the surface form of the silicon layer having roughness. As a result, opposing areas between the electrodes stacking the dielectric layers from above and under is increased, and the capacitance of the capacitor increases.

Furthermore, a method for manufacturing a capacitor according to the present invention includes the following steps.

Firstly, a silicon layer which becomes a first electrode layer in transition state between a polycrystal and an amorphous is formed by using chemical vapor deposition method. Secondly, the silicon layer is thermally treated with the surface of the silicon layer being exposed. Accordingly, a dielectric layer is formed on the surface of the silicon layer. Furthermore, a second electrode layer is formed on a surface of the dielectric layer.

In another manufacturing method, thermal treatment is carried out after the formation of a silicon layer in transition state from a polycrystalline silicon layer to an amorphous. The silicon layer in transition state is assumed to be in the condition of a polycrystal grain included in a region in amorphous state. By carrying out thermal treatment under this condition, the polycrystal grows, and roughness having a large curvature is generated on a surface of the silicon layer Therefore, by forming a dielectric layer on the surface of the silicon layer having a large radius of curvature and smooth rough form, local electric field concentration is prevented, and thus reliability of the capacitor is improved The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
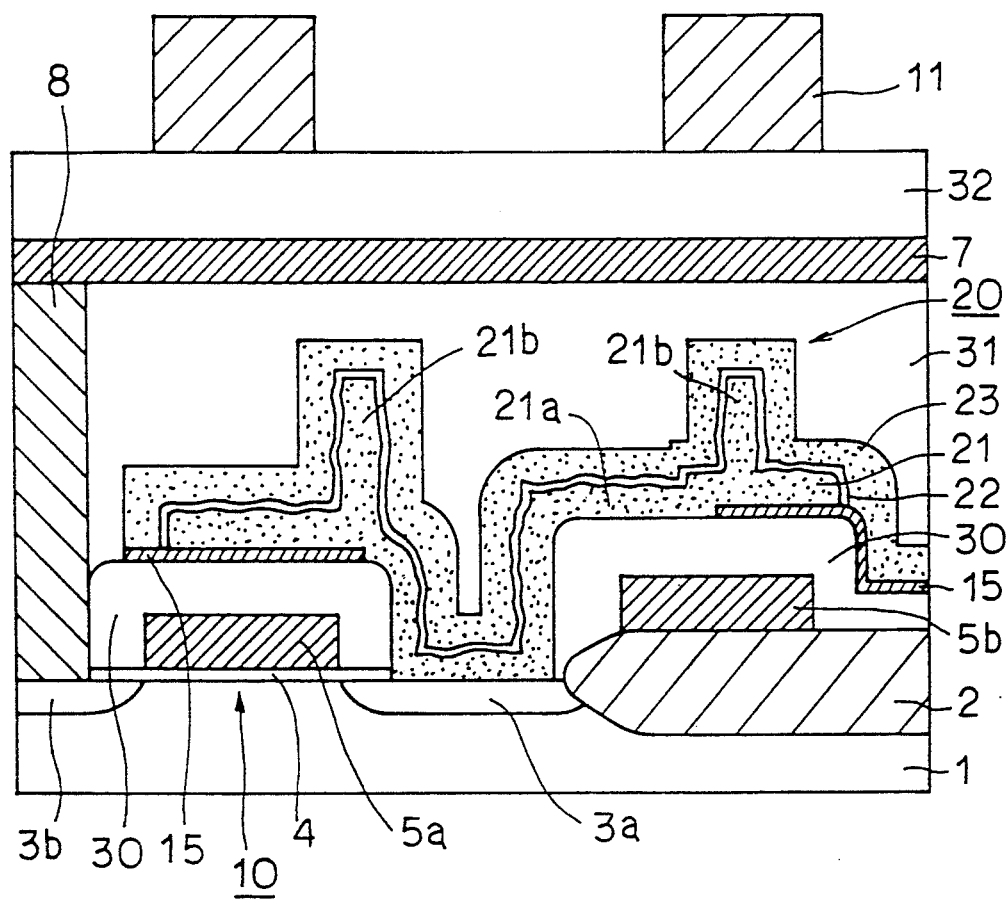
FIG. 1 is a cross section of a memory cell of a DRAM formed by the manufacturing method in accordance with the present invention.

Referring to FIG. 1, a memory cell includes one transfer gate transistor 10 and one capacitor 20. Transfer gate transistor 10 includes a pair of n+ impurity regions 3a, 3b formed on a surface of a p type silicon substrate 1 with a prescribed distance inbetween, and a gate electrode (word line) 5a formed with a thin gate insulating film 4 thereunder on the surface of p type silicon substrate 1. A word line 5b is formed on a surface of a field oxide film 2 formed in a prescribed region on the surface of p type silicon substrate 1. A first interlayer insulating layer 30 covers around gate electrode 5a and word line 5b.

Capacitor 20 forms a so-called stacked type capacitor constituted by a stacked layer structure of a lower electrode 21, a dielectric layer 22, and an upper electrode 23. Lower electrode 21 is structured by two portions, for the convenience of description. A first portion is a base portion 21a extending with first interlayer insulating layer 30 interposed, from a surface of gate electrode 5a to an upper part of word line 5b. A second portion is a cylindrical portion 21b cylindrically projected in a vertical upward direction to the surface of p type silicon substrate 1 from a surface of base portion 21a. A stacked capacitor including lower electrode 21 having such a form is referred to as a cylindrical stacked capacitor. Approximately 100 nm level of roughness formed by manufacturing method mentioned below is formed on the surface of lower electrode 21 of the cylindrical stacked capacitor. By this surface form, opposing areas of lower electrode 21 and upper electrode 23 opposing through dielectric layer 22 increases, and capacitance of the capacitor increases. Dielectric layer 22 is constituted by a stacked layer of a silicon nitride film and a silicon oxide film. Nitride films 15, 15 remain on a surface of first interlayer insulating layer 30. These nitride films 15, 15 serve to prevent lower interlayer insulating layer 30 from being overetched in manufacturing step.

Furthermore, a thick second interlayer insulating layer 31 covers an upper part of a stacked capacitor 20. A contact hole extending to one n+ impurity region 3b of transfer gate transistor 10 is formed on a prescribed region of second interlayer insulating layer 31. In this contact hole, a tungsten plug 8 formed, for example, by selective CVD method is filled. A bit line 7 is placed on a surface of second interlayer insulating layer 31, and connected to one n+ impurity region 3b of transfer gate transistor 10 through tungsten plug 8. A third interlayer insulating layer 32 is formed on an upper part of bit line 7. An interconnection layer 11 of a prescribed form is formed on a surface of third interlayer insulating layer 32.

Now, a first embodiment of method of a manufacturing memory cell of DRAM shown in FIG. 1 will be described.

Figure 2:
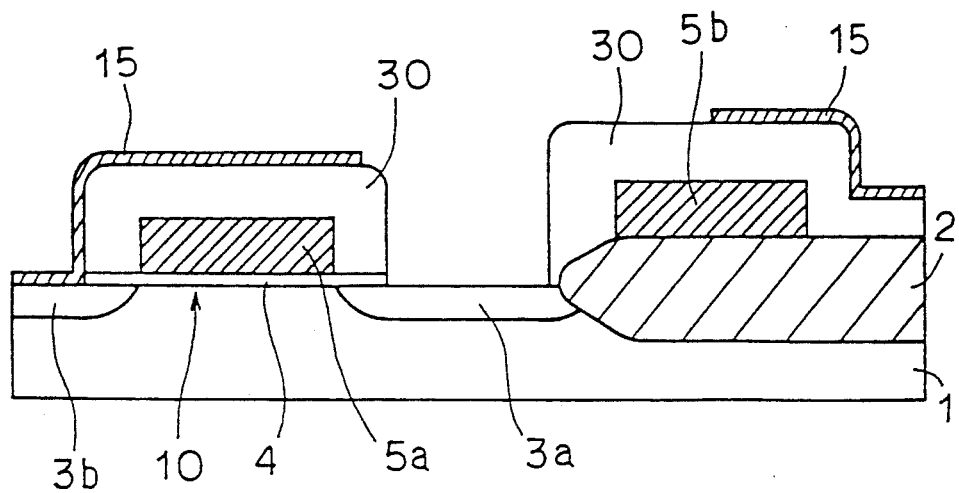
FIGS. 2, 3, 4, 5, 6, 7, 8, 9, 10 and 11 are cross sections showing, in order the manufacturing steps of the memory cell of DRAM in accordance with a first embodiment of the present invention.

Referring to FIG. 2, thick field oxide film 2 is formed on a prescribed region of the surface of p type silicon substrate 1. On the surface of p type silicon substrate 1, a gate oxide film 4 is formed by thermal oxide method. Thereafter, the polycrystalline silicon layer and the insulating layer are deposited in the whole region on the surface of p type silicon substrate 1, and patterned in a prescribed form. Therefore, gate electrode 5a and word line 5b are formed. By ion-implanting impurities to the surface of p type silicon substrate 1 using gate electrode 5a as a mask, n+ impurity regions 3a and 3b are formed. Thereafter, the insulating layer is deposited again on the whole region, and selectively removed by anisotropic etching. By this step, the insulating layer is left only on sidewalls of gate electrode 5a and word line 5b. Accordingly, first interlayer insulating layer 30 is formed around gate electrode 5a and word line 5b. After a thin nitride film 15 is formed on the whole region, it is patterned in a prescribed form.

Figure 3:
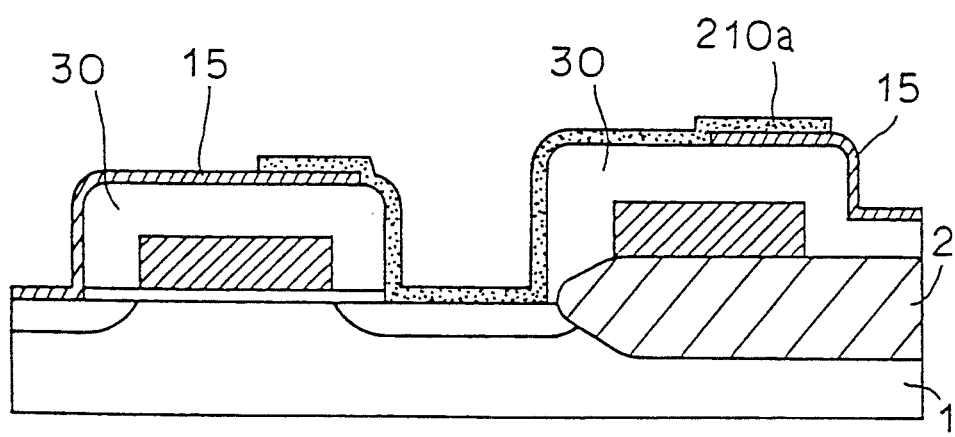

Referring to FIG. 3, a polycrystalline silicon layer 210a is deposited on the whole region on p type silicon substrate 1 by low pressure CVD method, and patterned in a prescribed form.

Figure 4:
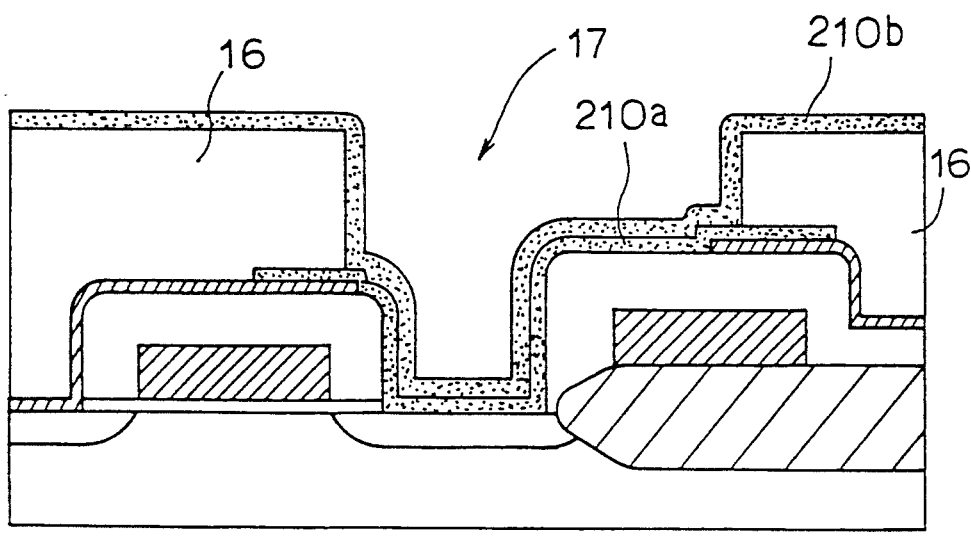

Referring to FIG. 4, a thick silicon oxide film 16 is deposited on the whole region on the surface of polycrystalline silicon layer 210a and the like, and an opening 17 is formed at a prescribed region. In this opening 17, a surface of polycrystal silicon layer 210a is exposed. Silicon oxide film 16 is used to form cylindrical portion 21b of a cylindrical stacked capacitor. The film thickness of the portion placed on upper part of polycrystal silicon layer 210a determines the height of cylindrical portion 21b of the capacitor. After forming opening portion 17 in a silicon oxide film 16, a polycrystalline silicon layer 210 having the film thickness of about 50 nm is deposited in this opening and on the surface of silicon oxide film 16 by using low pressure CVD method. This polycrystalline silicon layer is formed at a temperature of about 620° C. by low pressure CVD method using silane, for example.

Figure 5:
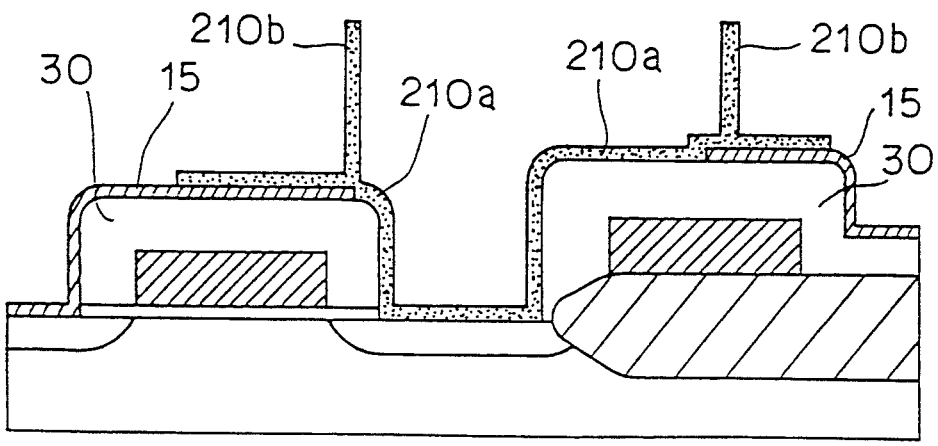

Referring to FIG. 5, polycrystalline silicon layer 210b is selectively etched by anisotropic etching. By this etching, the part of polycrystalline silicon layer 210b which is placed on a flat surface of silicon oxide film 16, or on the surface of flat portion of polycrystal silicon layer 210a is selectively removed. Polycrystalline silicon layer 210a and selectively left polycrystalline silicon layer 210b are integrally formed. Thereafter, silicon oxide film 16 used for the formation of a cylindrical portion of the cylindrical stacked capacitor is removed by etching. A silicon nitride film 15 prevents first interlayer insulating layer 30 from being overetched in this step of etching.

Figure 6:
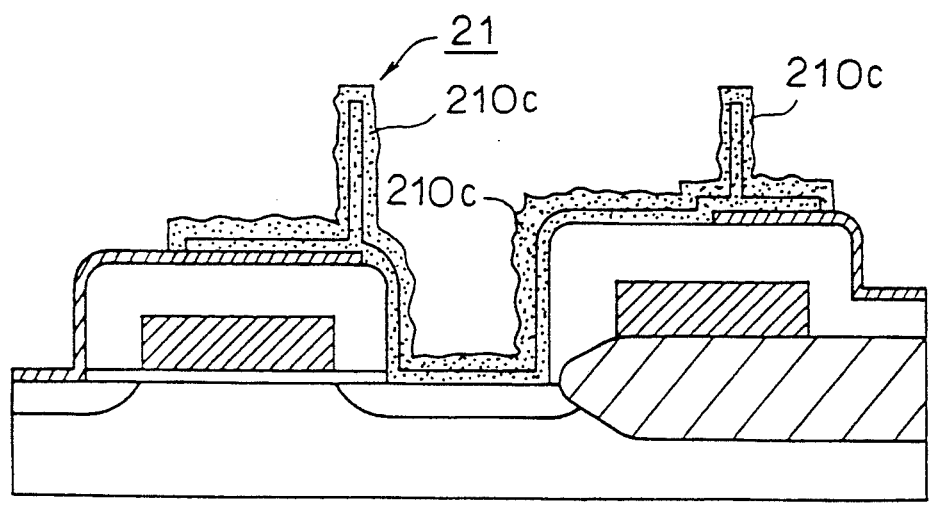

Referring to FIG. 6, a silicon layer is formed on the surface of polycrystalline silicon layers 210a and 210b which will be the framework of the lower electrode of the capacitor by CVD (Chemical Vapor Deposition) method. Film formation condition of CVD method uses a monosilane gas, or a monosilane gas diluted by nitrogen or helium as a material gas. The pressure of the monosilane gas is set to 100 Pa or less, and the film formation temperature is set to be not lower than 560° C. and lower than 600° C. As one example, the silicon layer is formed with the pressure of the monosilane gas set to 15 Pa, and having its film formation temperature set to 573° C. In this case, about 100 nm of roughness is formed on the surface of the silicon layer. Now, formation steps of the silicon layer is described in "Fabrication of Storage Capacitance-Enhanced Capacitors with a Rough Electrode" Yoshio Hayashide et al., Extended Abstracts of the 22nd Conference on Solid State Devices and Materials, 1990, pp. 869-872. Accordingly, a lower electrode 21 is formed by patterning the silicon layer which has rough surface.

Figure 7:
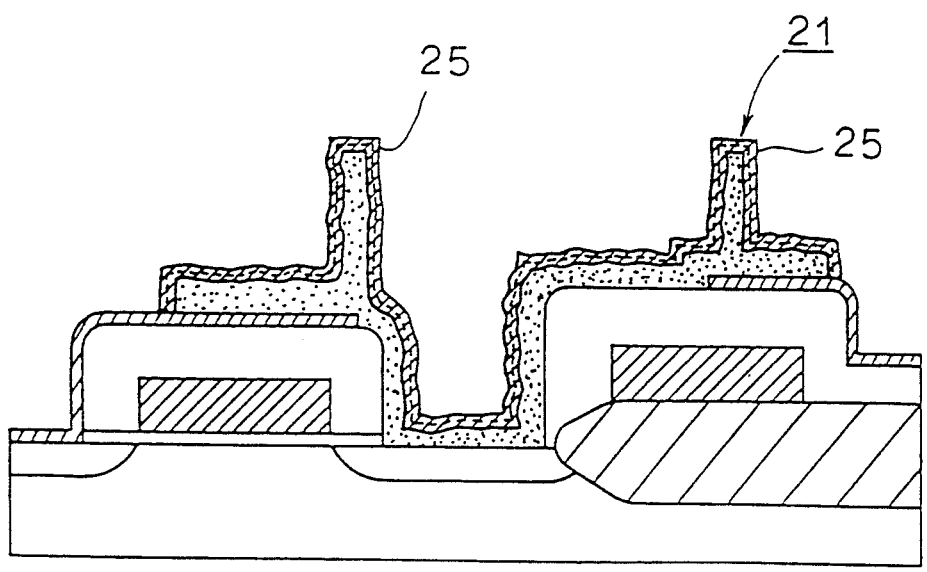

Referring to FIG. 7, by oxidizing the silicon layer on the surface of lower electrode 21, a silicon oxide film 25 is formed on the surface of the silicon layer.

Figure 8:
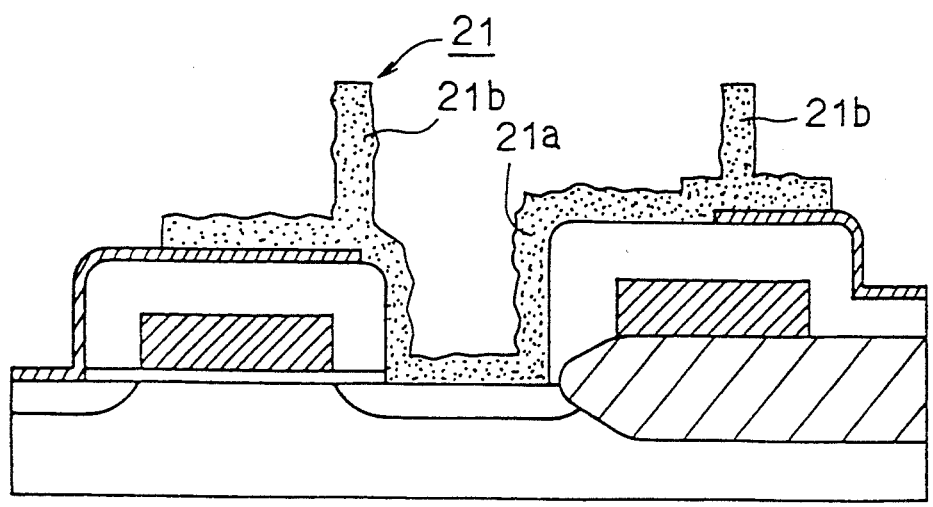

Referring to FIG. 8, by removing silicon oxide film 25 formed on the surface of the silicon layer with hydrofluoric acid solution, the surface of the silicon layer is exposed. The rough form on the surface of lower electrode 21 is adjusted by this step of oxidation.

Figure 12:
FIG. 12 is an enlarged cross section schematically showing a lower electrode of a capacitor corresponding to the one in FIG. 6.
Figure 13:
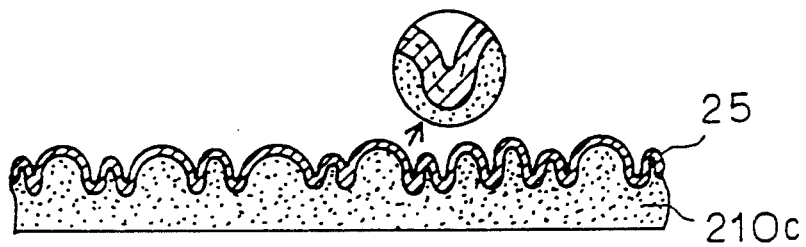
FIG. 13 is a partially enlarged cross section showing a lower electrode of a capacitor corresponding to the one in FIG. 7.
Figure 14:
FIG. 14 is a partially enlarged cross section showing a lower electrode of a capacitor corresponding to the one in FIG. 8.

Now, further description will be given in detail on the steps shown in FIGS. 6 to 8. FIGS. 12 to 14 are partial enlarged cross sections schematically showing the form of the surface of the silicon layer in the steps shown in FIGS. 6 to 8. Firstly, referring to FIG. 12 which corresponds to FIG. 6, about 100 nm of semispherical protrusions are formed on the surface of a silicon layer 210c formed by CVD method. There are partially narrowed places between the protrusions.

Referring to FIG. 13 which corresponds to FIG. 7, oxide treatment is carried out on the surface of silicon layer 210c. As an oxidizing method, thermal oxidation is carried out in vapor atmosphere at the temperature ranging from 800-1000° C., for example, at 850° C. for about ten minutes. By this oxidation, a silicon oxide film 25 having the film thickness of, for example, about 10 nm is formed on the surface of silicon layer 210c. Approximately half of the film thickness of silicon oxide film 25 is generated from the surface of the original silicon layer to the inside. Therefore, an interface between silicon oxide film 15 and silicon layer 210c is recessed from the surface of the original silicon layer 210c. As a method of thermal oxidation, not only wet oxidation using the vapor mentioned above, but dry oxidation carried out under oxygen atmosphere, or dry oxidation carried out under the atmosphere including hydrogen chloride (HCl) in oxygen may be used.

Referring to FIG. 14 which corresponds to FIG. 8, when silicon oxide film 25 formed on the surface of silicon layer 210c is removed by using a solution of hydrofluoric acid or the like, the intervals between rough portions formed on the surface of silicon layer 210c will be expanded. If the dielectric layer such as a nitride film is formed thereafter, the dielectric layer material can be prevented from being filled in the region between the rough portions of the surface of the silicon layer can be prevented.

To achieve such effect, the thickness of silicon oxide film 25 is determined such that the interval between the rough portions expanded by the silicon oxide film entering inward from the surface of silicon layer 210c is twice or more of the thickness of the dielectric layer.

Figure 9:
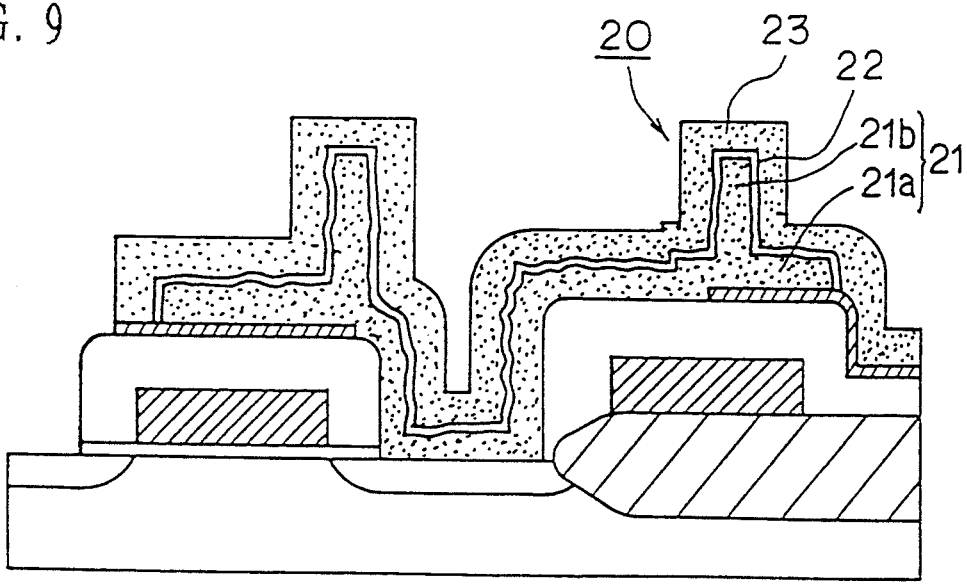

Following the steps mentioned above, referring to FIG. 9, the silicon nitride film is deposited on the surface of lower electrode 21 by CVD method. Then, by carrying out thermal oxidation on the surface of the silicon nitride film, a silicon oxide film is formed. Accordingly, dielectric layer 22 constituted by a multilayer film of the silicon nitride film and the silicon oxide film is formed. Dielectric layer 22 has a film thickness of about 5-10 nm equivalent in the film thickness of oxide film. An upper electrode 23 of polycrystalline silicon layer is formed on the surface of dielectric layer 22 by using CVD method.

Figure 10:
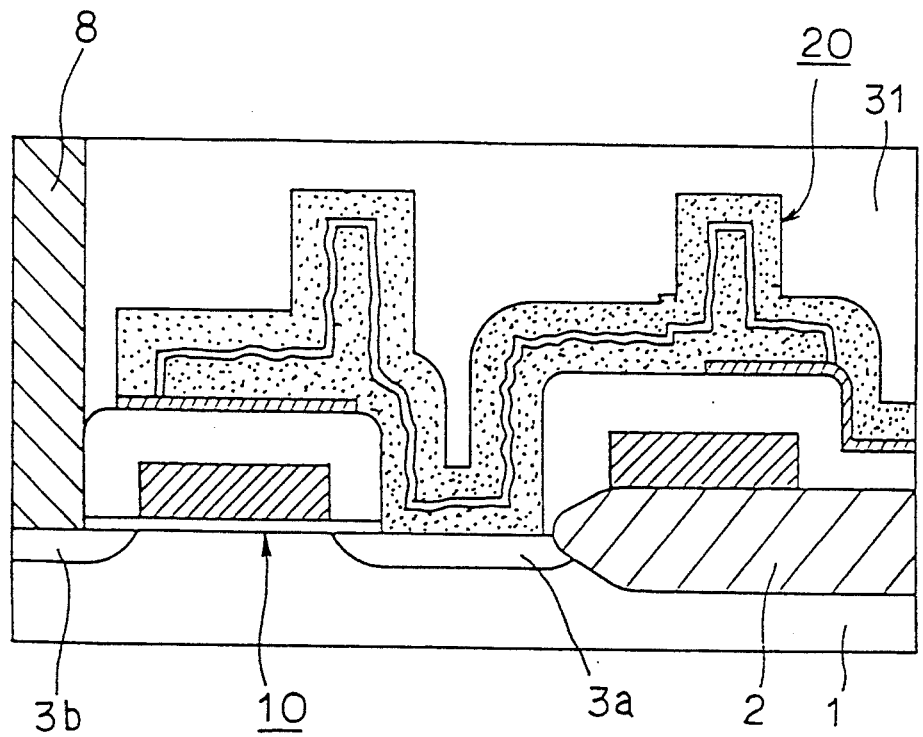

Referring to FIG. 10, a thick second interlayer insulating layer 31 is formed on the whole surface of p type silicon substrate 1, and the contact hole is formed at a prescribed region. For example, by selective CVD method, metals such as tungsten (W) is filled in the contact hole to form a bit line contact 8.

Figure 11:
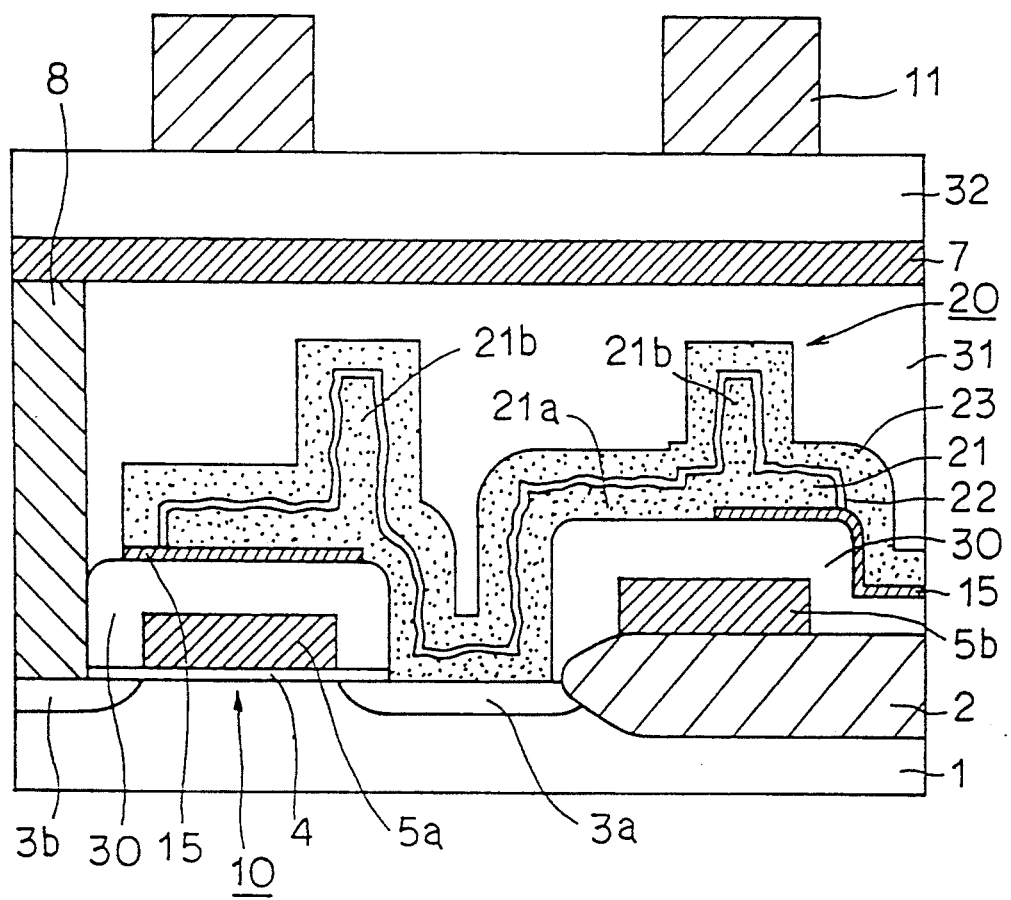

Referring to FIG. 11, bit line 7 is formed on the surface of second interlayer insulating layer 31. Additionally, third interlayer insulating layer 32 is formed on bit line 7. Interconnection layer 11 is formed on the surface of third interlayer insulating layer 32. By the step mentioned above, manufacturing step of a memory cell including a cylindrical stacked capacitor is completed.

The silicon layer of lower electrode 21 is influenced by various thermal treatment during processing and changed to a polycrystalline state after the formation of the silicon layer of lower electrode 21. However, the rough form of the interface between lower electrode 21 and dielectric layer 22 is maintained.

Figure 21:
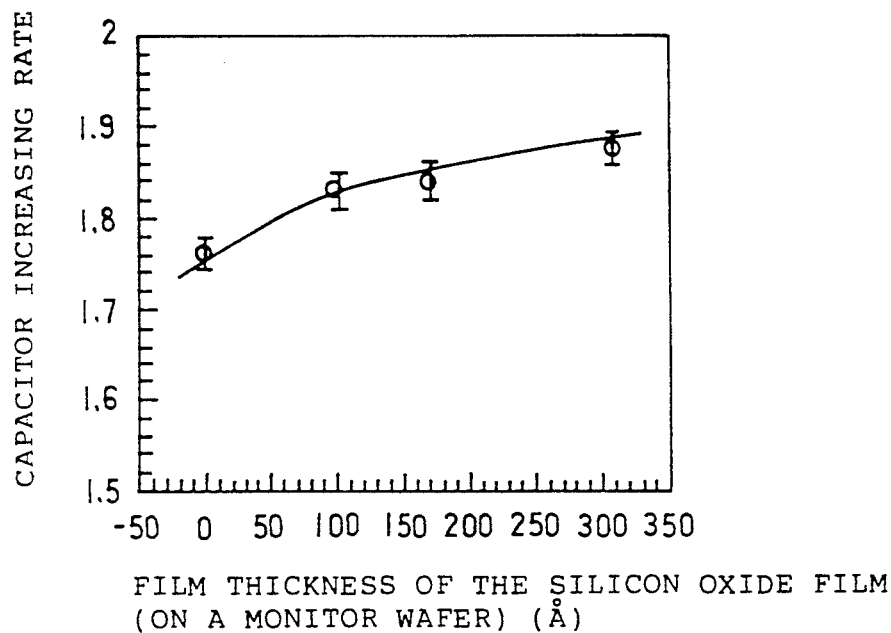
FIG. 21 is a graph showing the relation between capacitor increasing rate of a capacitor and the silicon oxide film formed in accordance with a first embodiment of the present invention.

The relation between the film thickness of the silicon oxide film and the capacity is verified by carrying out various experiments in the capacitor of the memory cell manufactured by the steps mentioned above. FIG. 21 is a graph showing the relation between the film thickness of the silicon oxide film formed on the surface of the silicon layer having the rough surface and the increasing rate of the capacity of the capacitor. The increasing rate of the capacity of the capacitor is based on the capacitor having a relatively smooth lower electrode surface, and indicates the rate of the case where plan projected areas are identical. As shown in FIG. 21, the capacity of the capacitor will increase by forming the lower electrode by silicon layer which is in a transition state from polycrystal to amorphous by low pressure CVD method. Additionally, if the film thickness of the oxide film formed on the surface of the silicon layer is increased, that is, if the quantity of the surface of the silicon layer removed by oxide treatment is increased, capacity of the capacitor is increased up to about 1.9 times at most in the range shown.

Figure 22:
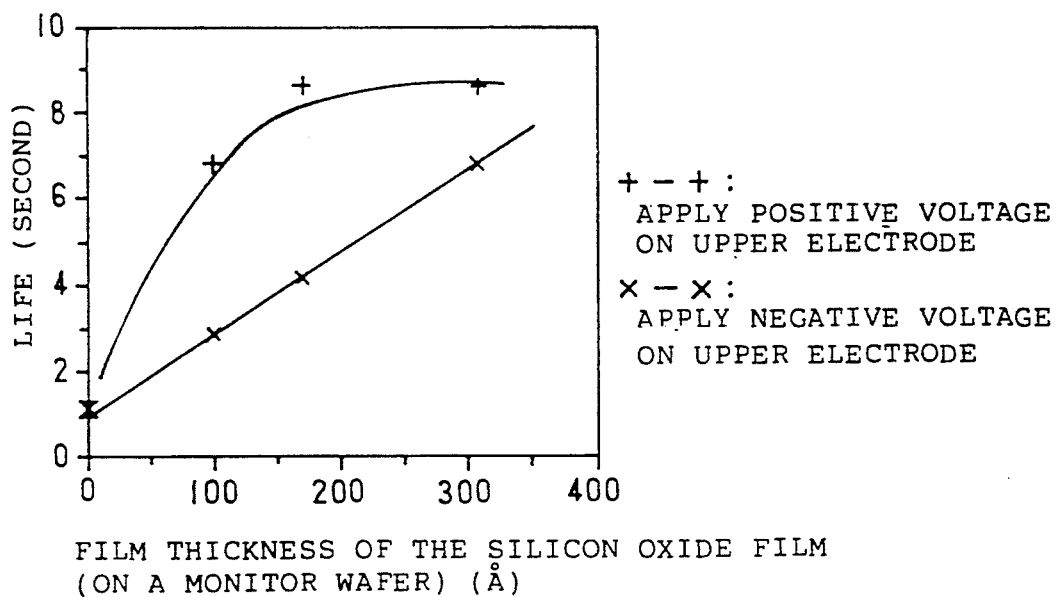
FIG. 22 is a graph showing the relation between life of a capacitor and the silicon oxide film formed in accordance with a first embodiment of the present invention.

Referring to FIG. 22, it is noted that the local electric field concentration is decreased, and life of the capacitor is increased by adjusting the rough form on the surface of lower electrode 21 by oxidation.

Figure 18:
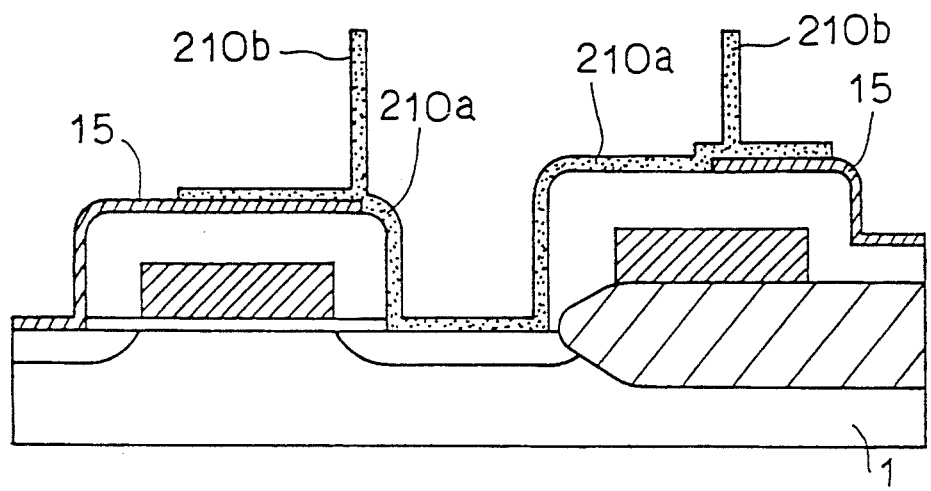
FIG. 18 is a cross section showing a main first step of the manufacturing a memory cell of a DRAM in accordance with a second embodiment of the present invention.
Figure 19:
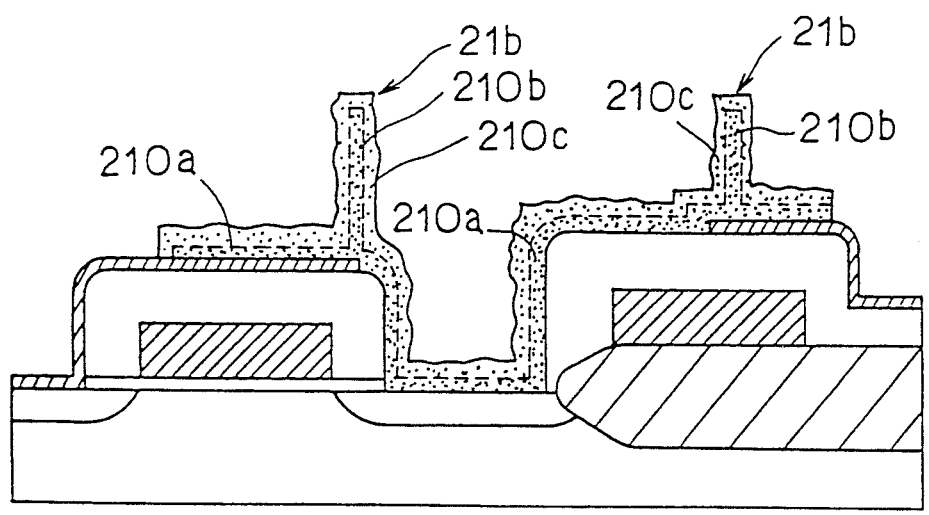
FIG. 19 is a cross section showing a manufacturing step following the manufacturing step shown in FIG. 18.

Next, method of manufacturing a memory cell of a DRAM in accordance with a second embodiment of the present invention will be described. FIG. 18 shows the same step as the one shown in FIG. 5 in the first embodiment. FIG. 19 shows the step shown in FIG. 6 in the same manner. That is, in FIG. 19, silicon layer 210c in transition state between polycrystal and amorphous is formed on the surface of polycrystal silicon layers 210a and 201b under the same condition as the first embodiment.

Figure 20:
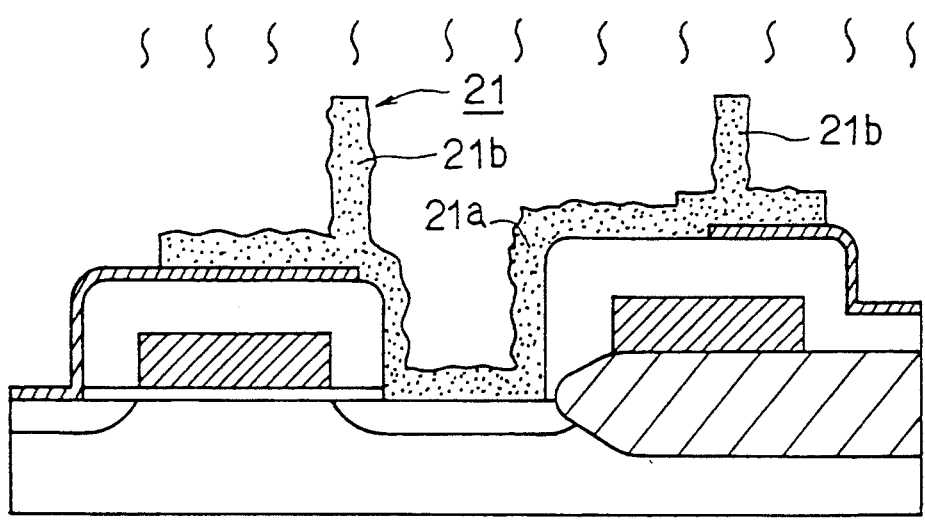
FIG. 20 is a cross section showing a manufacturing step following the manufacturing step shown in FIG. 19.
Figure 23:
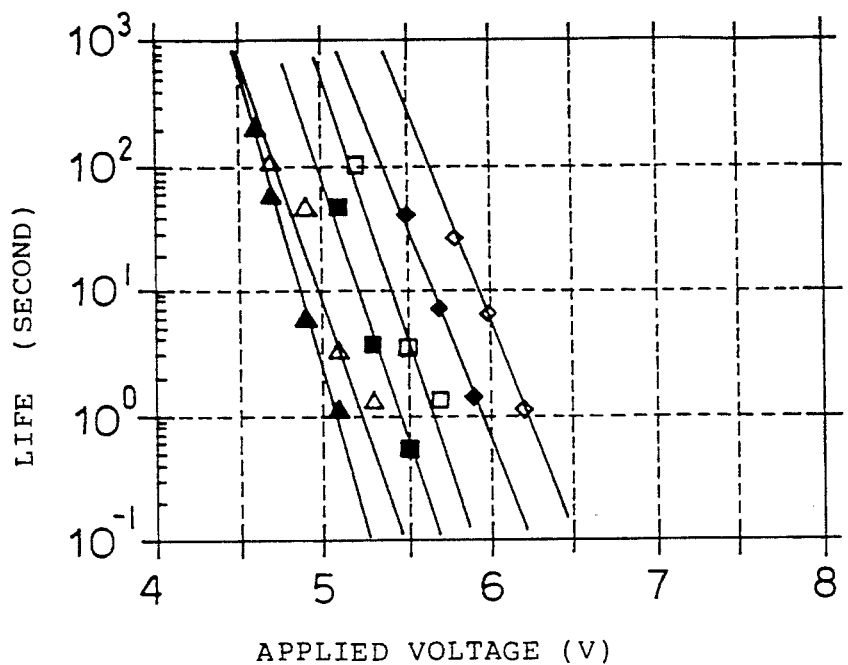
FIG. 23 is a graph showing the relation between an applied voltage and life of a capacitor formed in accordance with a second embodiment of the present invention.
Figure 24:
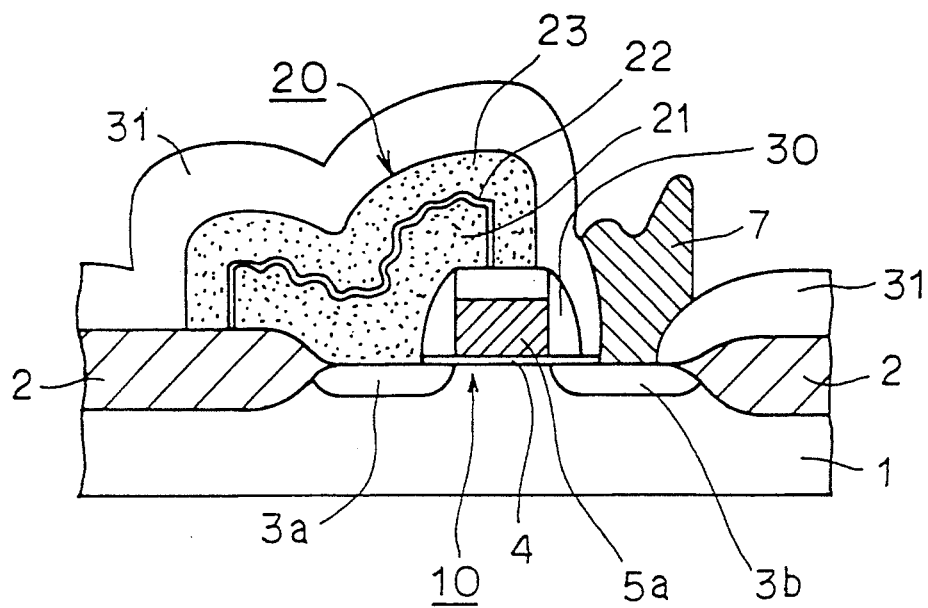
FIG. 24 is a cross section of a memory cell of a conventional DRAM.
Figure 25:
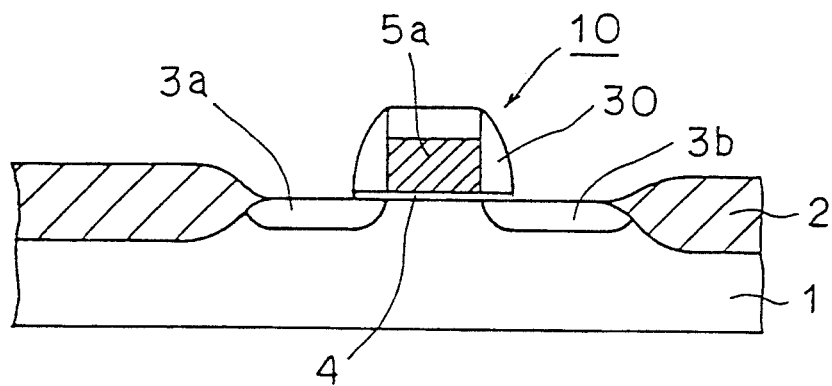
FIGS. 25, 26, and 27 are cross sections showing, in order, steps of manufacturing the memory cell of DRAM shown in FIG. 24.
Figure 26:
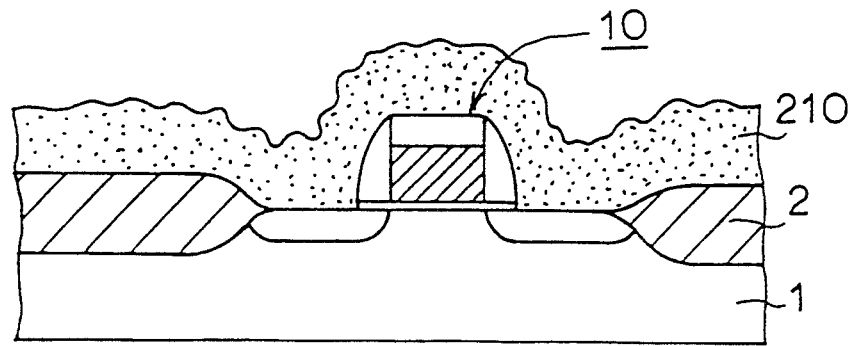
Figure 27:
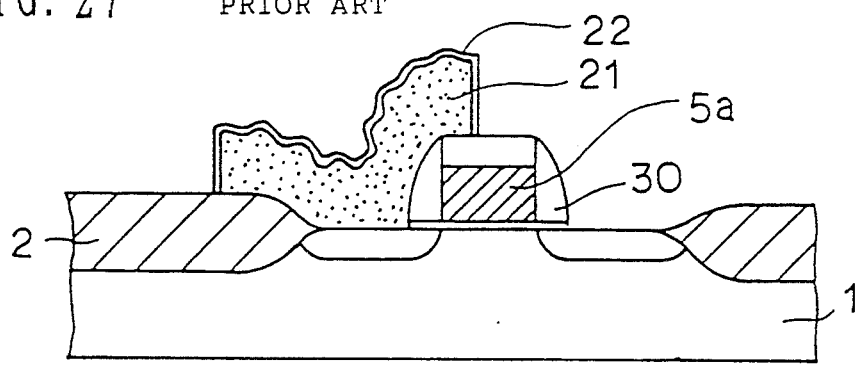
Figure 28:
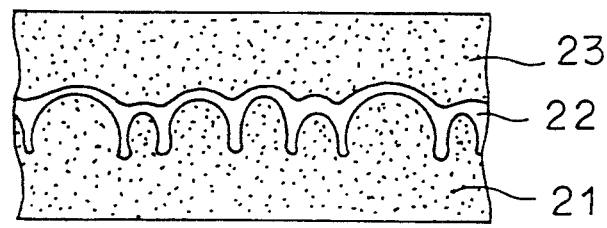
FIG. 28 is a partial cross section showing a part of a conventional capacitor.

Referring to FIG. 20, immediately after the formation of silicon layer 210c, thermal treatment is carried out in the vacuum or $N_2$, or inert gas such as Ar gas for about 10 minutes to 5 hours, without taking out the semiconductor device (wafer) out from the reduced pressure vapor deposition apparatus, at the temperature of 500–600° C. This thermal treatment changes crystallinity of silicon layer 210c, and radius of curvature of roughness of the surface of the silicon layer is enlarged. As mentioned above, silicon layer 210c having the roughness is formed in a transition region between polycrystal state and amorphous state. However, a polycrystalline component and a component of amorphous are included in the layer. When thermal treatment is carried out in the vacuum or inert gas immediately after the formation of this silicon layer, the amorphous component is turned to polycrystal, and silicon atoms in the amorphous silicon move to enlarge radius of curvature radius of the rough portions. Such phenomenon is observed only in a condition when the oxide film and the like do not exist in the surface of the silicon layer. Electric concentration on the rough surface is restrained when radius of curvature of the rough portions is enlarged in such manner. As a result, a breakdown voltage of the dielectric layer formed on the surface of the silicon layer is improved. Furthermore, reliability of the capacitor is improved due to the improvement of the breakdown voltage. FIG. 23 is a graph showing the relation between an applied voltage and life of the capacitor manufactured by the method mentioned above. As shown in FIG. 23, it is noted that the longer the time of the thermal treatment carried out immediately after the formation of the silicon layer, the longer becomes the life of the capacitor.

Next, manufacturing method of a memory cell of DRAM in accordance with a third embodiment of the present invention will be described.

The third embodiment is the combination of the step of oxidation of lower electrode 21 in the capacitor in the first embodiment, and the step of thermal treatment of lower electrode in the second embodiment. That is, after the steps of formation of the silicon layer, formation of the oxide film, and removal of the oxide film by low pressure CVD method shown in FIGS. 6 to 8, the step of thermal treatment shown in FIG. 20 are continuously carried out in an oxygen-free atmosphere in the low pressure vapor deposition apparatus. Expanding the surface areas in the lower electrode in the capacitor, and increasing the life of the capacitor are also possible in this manufacturing method.

Figure 15:
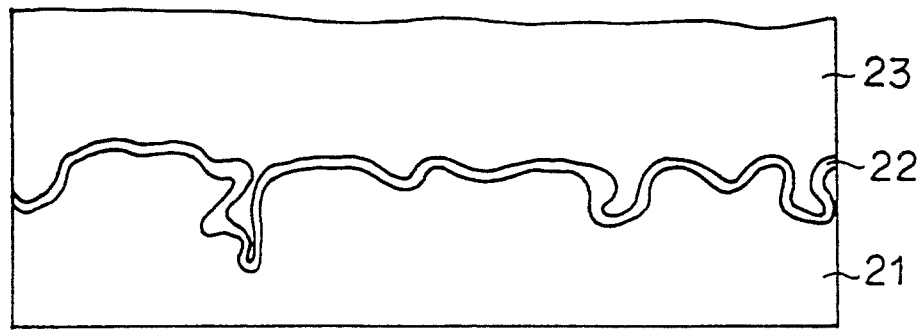
FIG. 15 is a cross section schematically showing a capacitor formed by chemical vapor deposition method in accordance with the present invention.
Figure 16:
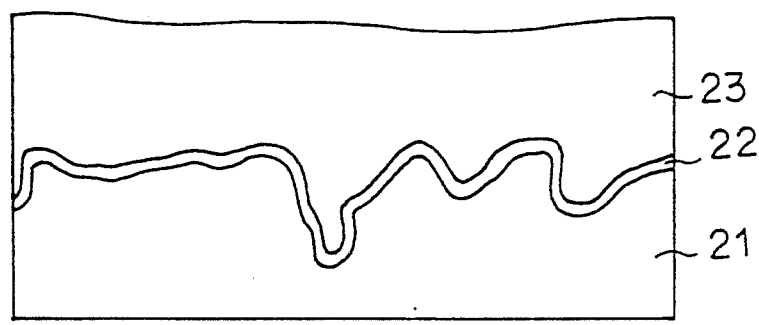
FIG. 16 is a cross section schematically showing a cross sectional structure of a capacitor manufactured by the method in accordance with a first embodiment of the present invention.
Figure 17:
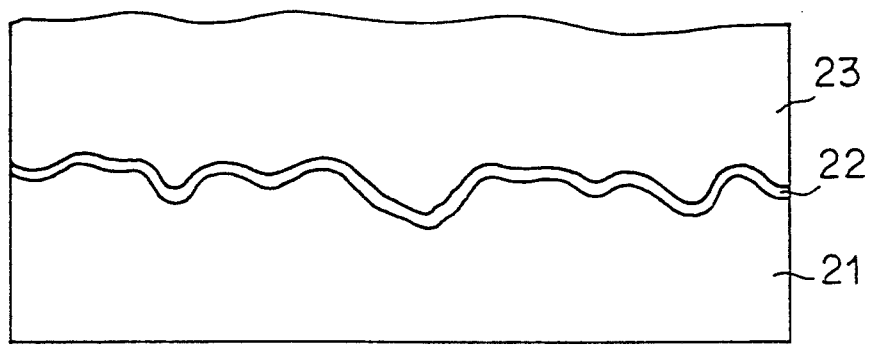
FIG. 17 is a cross section schematically showing a capacitor manufactured by the method in accordance with a second embodiment of the present invention.

Now, the cross sectional form of the capacitor manufactured in accordance with the embodiment mentioned above will be described. FIGS. 15 to 17 are cross sections each schematically showing the cross sectional structure of the capacitor manufactured under the following conditions.

FIG. 15 . . . a lower electrode 21 formed under the condition of the temperature of 573° C. and 0.2 Torr, by CVD method.

FIG. 16 . . . a silicon oxide film having the film thickness of 30 nm formed and further removed after the step of CVD under the condition mentioned above.

FIG. 17 . . . anneal processing carried out for 10 hours in the vacuum after the step of CVD shown in FIG. 15.

FIGS. 15 to 17 are drawn to a scale almost 100 thousands times enlarged. It is clear that the intervals between the rough portions on the surface of lower electrode 21 are increased by oxidation in comparison with FIGS. 15 and 16. It should be noted that the surface of lower electrode 21 is formed in a smooth manner by thermal treatment in comparison with FIGS. 15 and 17.

In the embodiments mentioned above, upper electrode 23 of the capacitor formed in the polycrystal silicon layer was described. However, it shall not be limited to it, and a high melting point metal film, a high melting point metal silicide film, or a compound film structure stacking the polycrystal silicon film and the high melting point metal silicide film may be used. Metal oxides such as tantalum pentoxide may be used as a gate dielectric layer.

According to the present invention, oxidation of the rough surface of the silicon layer formed by chemical vapor deposition method and removal of the oxide film enlarged the intervals between the rough portions, and therefore the intervals can be used as effective capacitance region. As a result, capacity of the capacitor can be increased without any increase of the planar occupation areas of the capacitor.

After the formation of the lower electrode having the rough surface by chemical vapor deposition method, thermal treatment is carried out in the oxygen-free atmosphere. Therefore, radius of curvature of the rough surface of the lower electrode can be increased, and thus reliability of the capacitor can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a capacitor having a stacked structure of a first electrode layer, a dielectric layer, and a second electrode layer, on a semiconductor substrate, comprising the steps of:

forming a silicon layer for said first electrode layer by chemical vapor deposition method in which a polycrystal silicon grain is included in an amorphous silicon layer, a surface of said silicon layer being formed with semispherical protrusions;

thermally treating said formed silicon layer with the surface of said silicon layer being exposed by heating said formed silicon layer in a vacuum at a temperature between about 500° C. and 650° C. for about 10 minutes to 5 hours;

forming a dielectric layer on the surface of said thermally treated silicon layer; and forming a second electrode layer on the surface of said dielectric layer.

2. A method of manufacturing a capacitor comprising a first electrode layer, a dielectric layer, and a second electrode layer, on a semiconductor substrate, comprising the steps of:

forming a silicon layer for said first electrode layer by a chemical vapor deposition method in which a polycrystal silicon grain is included in an amorphous silicon layer, a surface of said silicon layer being formed with semispherical protrusions;

oxidizing the surface of said silicon layer having the semispherical protrusions and forming a silicon oxide film on the surface of said silicon layer;

removing at least said silicon oxide film, and exposing the surface of said silicon layer;

heating said exposed silicon layer in a vacuum at a temperature between about 500° C. and 650° C. for about 10 minutes to 5 hours;

forming the dielectric layer on the surface of said heated silicon layer; and forming the second electrode layer on the surface of said dielectric layer.

3. A method of manufacturing a capacitor comprising a first electrode layer, a dielectric layer, and a second electrode layer, on a semiconductor substrate, comprising the steps of:

forming a silicon layer for said first electrode layer by a chemical vapor deposition method in which a polycrystal silicon grain is included in an amorphous silicon layer, a surface of said silicon layer being formed with semispherical protrusions;

oxidizing the surface of said silicon layer having the semispherical protrusions and forming a silicon oxide film on the surface of said silicon layer;

removing at least said silicon oxide film, and exposing the surface of said silicon layer;

heating said exposed silicon layer in an inert gas atmosphere at a temperature between about 500° C. to 650° C. for about 10 minutes to 5 hours;

forming the dielectric layer on the surface of said heated silicon layer; and forming the second electrode layer on the surface of said dielectric layer.

4. The method of claim 3, wherein the inert gas is one of nitrogen and argon.

5. A method of manufacturing a capacitor having a stacked structure of a first electrode layer, a dielectric layer, and a second electrode layer, on a semiconductor substrate, comprising the steps of:

forming a silicon layer for said first electrode layer by a chemical vapor deposition method in which a polycrystal silicon grain is included in an amorphous silicon layer, a surface of said silicon layer being formed with semispherical protrusions;

thermally treating said formed silicon layer with the surface of said silicon layer being exposed by heating said formed silicon layer in an inert gas atmosphere at a temperature between about 500° C. and 650° C. for about 10 minutes to 5 hours;

forming a dielectric layer on the surface of said thermally treated silicon layer; and forming a second electrode layer on the surface of said dielectric layer.

6. The method of claim 5, wherein the inert gas is one of nitrogen and argon.

* * * * *